United States Patent [19]
Loris

[11] Patent Number: 4,472,763
[45] Date of Patent: Sep. 18, 1984

[54] PLUG-IN MODULE CARD HOLDER

[75] Inventor: William P. Loris, Bloomingdale, Ill.

[73] Assignee: Rockwell International Corporation, El Segundo, Calif.

[21] Appl. No.: 453,848

[22] Filed: Dec. 27, 1982

[51] Int. Cl.³ ............................................. H05K 5/00
[52] U.S. Cl. .................................... 361/399; 211/41; 312/320
[58] Field of Search ............... 211/41, 86; 312/320; 361/399, 415

[56] References Cited

U.S. PATENT DOCUMENTS

| 3,476,258 | 11/1969 | Dorsett | 312/320 X |
| 3,688,915 | 9/1972 | Ramsey | 211/123 |
| 4,256,356 | 3/1981 | Roth | 312/320 |

FOREIGN PATENT DOCUMENTS 1053352 7/1965 United Kingdom ............... 211/41 C

Primary Examiner—William E. Lyddane
Assistant Examiner—Joseph B. Falk
Attorney, Agent, or Firm—Patti, C. G.; V. Lawrence Sewell; H. Fredrick Hamann

[57] ABSTRACT

This disclosure depicts a plug-in module card holder for supporting a plurality of circuit cards, each of the cards having a securing level with a notch. The plug-in module card holder comprises at least two card shelf plates and a strengthening strip for each of the card shelf plates. The card shelf plates are oriented in a parallel relationship and each has one or more grooves. A circuit card is retained in one of the grooves in each of the two card shelf plates. Each of the card shelf plates has an outer edge having a tab with first and second offset channels. The strengthening strip has an engaging portion consisting of first and second offset ridges for engaging the first and second channels of the tab of the card shelf plate. The strengthening portion also has a retaining portion for mating with the notch in the lever and thereby securing the circuit card in the circuit card holder with a cam action.

5 Claims, 5 Drawing Figures

PLUG-IN MODULE CARD HOLDER

BACKGROUND OF THE INVENTION

This invention relates in general to modular electronic systems in which individual plug-in module cards having different functions fit into a shelf assembly in an equipment cabinet. The modules may be of different thicknesses depending upon the amount of electronic circuitry contained therein. Typically, the modules have flanges on the top and bottom of their frames, which fit into grooves in shelf plates in the shelf assembly. The shelf plates in the shelf assembly are generally made of metal to provide enough strength to firmly hold the modules in position.

There is a significant reduction in cost if the shelf plates in the shelf assembly could be molded out of plastic or a similar material. However, due to the flexibility of these materials, it is not possible to securely hold the modules in the shelf assembly, especially toward the center of the shelf plate. The present invention overcomes this problem in the prior art.

SUMMARY OF THE INVENTION

The present invention involves a plug-in module card holder for supporting a plurality of circuit cards, each of the cards having a securing lever with a notch. The plug-in module card holder composes at least two card shelf plates and a strengthening strip for each of the card shelf plates. The card shelf plates are oriented in a parallel relationship and each has one or more grooves. A circuit card is retained in each one of the grooves in each of the two card shelf plates. Each of the card shelf plates has an outer edge having a tab with first and second offset channels. The strengthening strip has an engaging portion consisting of first and second offset ridges for engaging the first and second channels of the tab of the card shelf plate. The strengthening portion also has a retaining portion for mating with the notch in the lever and thereby securing the circuit card in the circuit card holder with a cam action.

OBJECTS OF THE INVENTION

It is a primary object of the invention to provide an improved module card holder.

It is another object of the present invention to provide a card shelf plate which can be molded out of plastic or similar material.

It is a further object of the present invention to provide a structurally rigid module card holder.

It is yet another object to provide a module card holder which has an integral actuator bearing surface.

BRIEF DESCRIPTION OF THE DRAWINGS

The features of the present invention which are believed to be novel are set forth with particularity in the appended claims. The invention, together with further objects and advantages may best be understood by reference to the following description taken in conjunction with the accompanying drawings, in the several figures of which like reference numerals identify like elements, and in which:

DESCRIPTION OF THE PREFERRED EMBODIMENT

Figure 1:
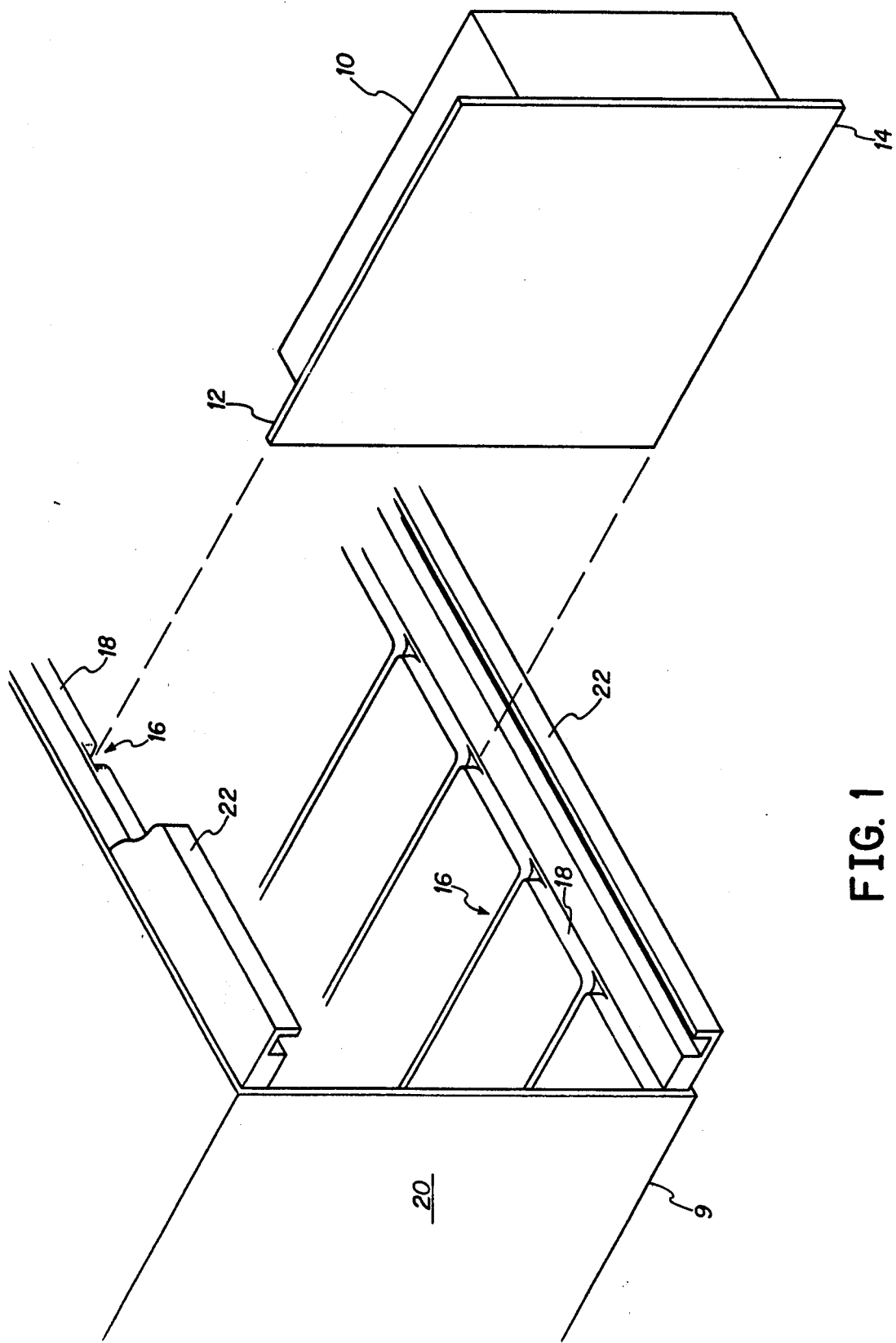
FIG. 1 is an exploded perspective view of the present invention.
Figure 2:
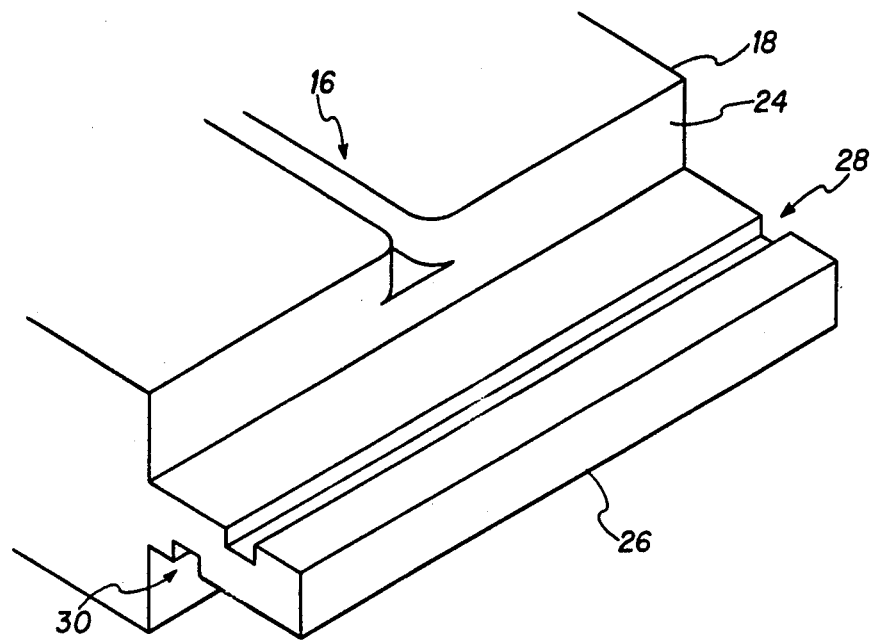
FIG. 2 is a perspective view of one portion of the present invention.
Figure 3:
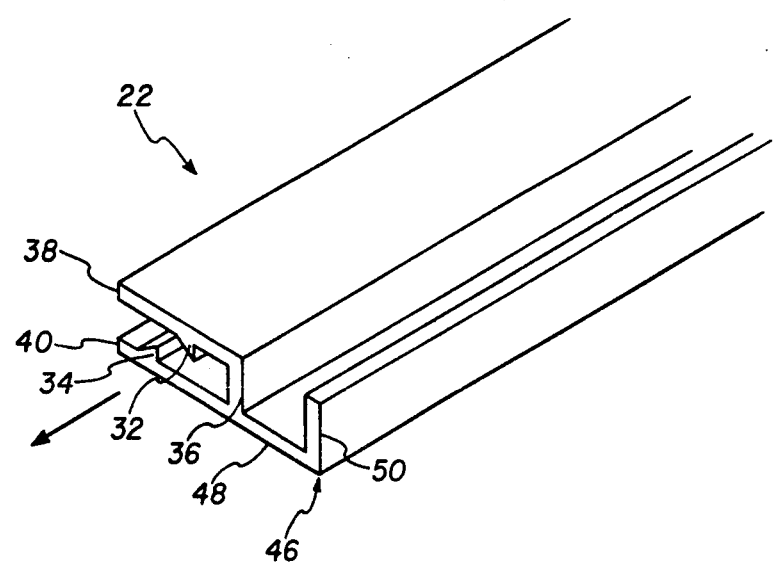
FIG. 3 is a perspective view of another portion of the present invention.

The present invention is directed to a shelf assembly 9 of an equipment cabinet which holds plug-in modular cards. As shown in FIG. 1, a module card 10, has a flange 12 at the top, and another flange 14 at the bottom of each card 10. The flanges 12 and 14 align with groove 16 in shelf plates 18 mounted to shelf sides 20 of the shelf assembly 9. The modular card 10 slides into the shelf assembly 9, and electrical contacts on the back of card 10 engage electrical connectors on the back wall of the shelf assembly 9.

The present invention is a plug-in module card holder comprising at least two card shelf plates 18, and a strengthening strip 22. The shelf plates 18 are molded from plastic or similar material, and the strengthening strip 22 is formed from a rigid material such as extruded aluminum.

Referring now to FIGS. 1-4, the shelf plates 18 are positioned in a parallel relationship such that the grooves 16 are aligned. Along an outer edge 24 of the shelf plate 18 is formed a tab 26, with first and second offset channels 28 and 30. The first and second offset channels 28 and 30 are on opposite sides of the tab 26 as shown in the drawings. The tab 26 has a substantially rectangular cross section in the preferred embodiment.

The strengthening strip 22 has an engaging portion consisting of first and second offset ridges 32 and 34. The strengthening strip 22, is substantially U-shaped, having a base 36 and first and second arms 38 and 40. The first ridge 32 is positioned on the inner side of the first arm 38, and the second ridge 34 is positioned on the other side of the second arm 40.

The U-shaped portion of the strengthening strip 22, fits over the tab 26, and the ridges 32 and 34 engage the grooves 28 and 30. The strengthening strip 22 may be slid onto tab 26 from an end or snapped directly over the tab 26. In the preferred embodiment, the ridges 32 and 34, have a generally triangular shape with a sloping leading edge which facilitates snapping the strengthening strip 22 over the tab 26 at a substantially vertical edge to retain the strip 22 in position.

Figure 4:
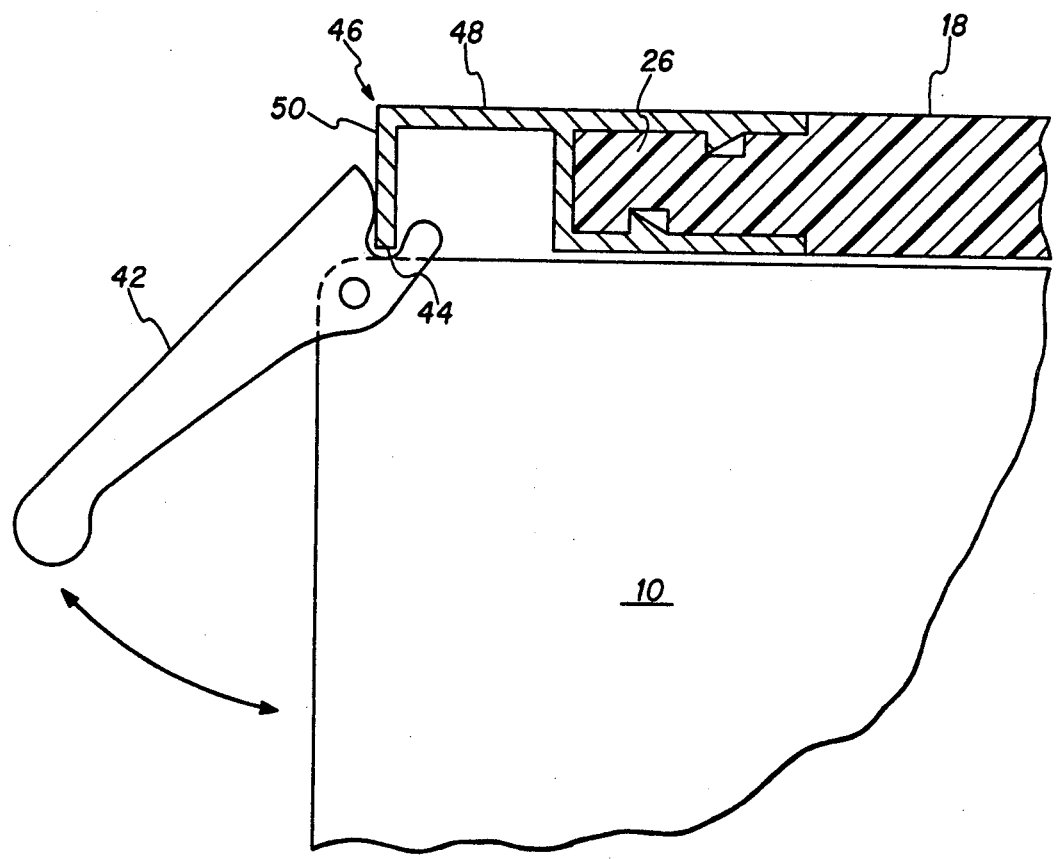
FIG. 4 is a cross-sectional view of the present invention.

As shown in FIG. 4, the modular card 10 may also have a lever 42, which has a notch 44. To fully insert the module card 10 into the shelf assembly 9, the notch 44 engages a retaining portion 46 of the strengthening strip 22, with a cam action. The lever is pushed down against the front of the card 10, and thereby securely holds the card 10 in the shelf assembly 9. The retaining portion 46 is L-shaped, and has first and second legs 48 and 50. The first leg 48, is attached to the base 36 of the engaging portion, and the second leg 50, engages the notch 44 in the lever 42.

Figure 5:
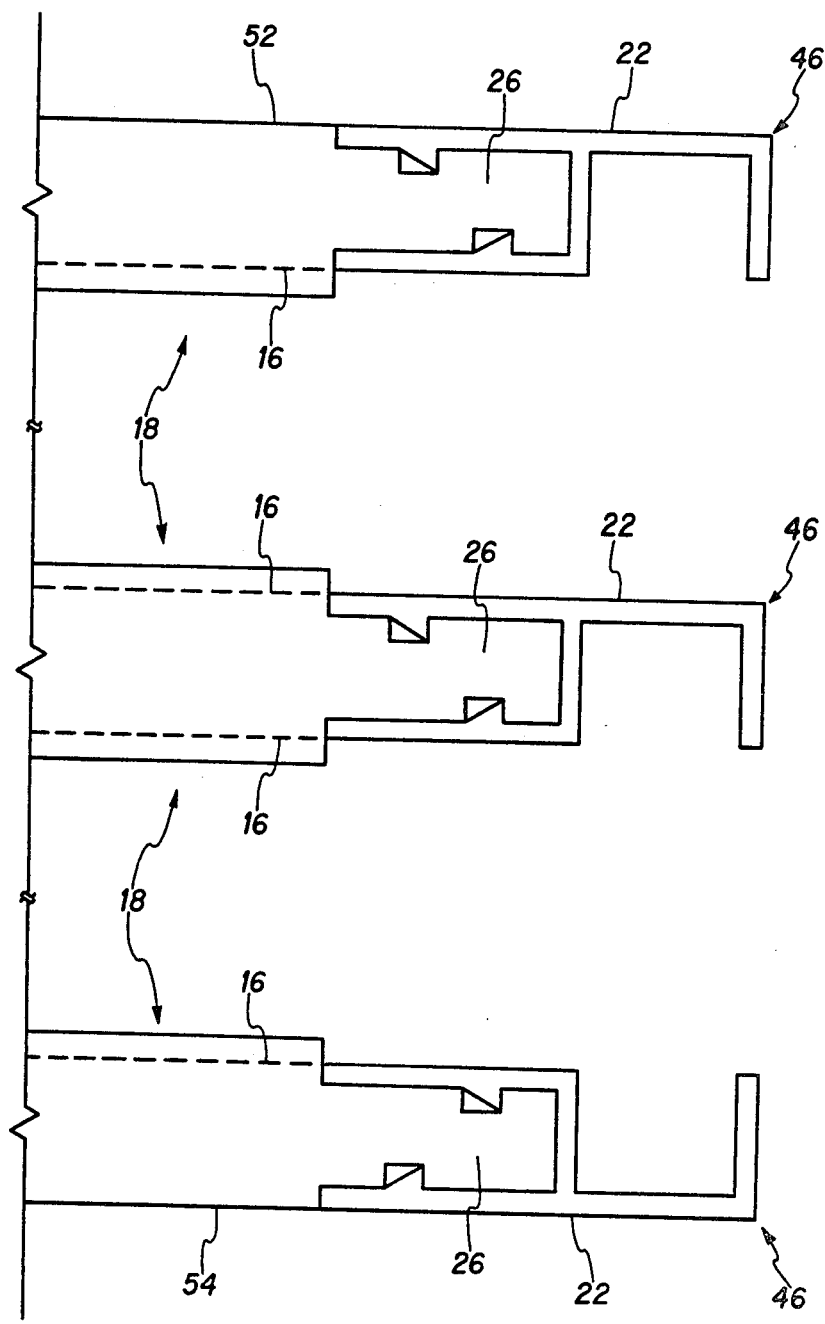
FIG. 5 is a cross-sectional view illustrating the relationship of the parts of the present invention.

As shown in FIG. 5, any number of shelf plates 18 may be utilized in a single shelf assembly 9. Other than top and bottom shelves 52 and 54, shelves 56 between shelf plates 52 and 54 have grooves 16 on both sides. The bottom shelf 54 actually has no functional need for the retaining portion 46. The retaining portion 46 on the shelves 56 could be reversed and the levers 42 on the modular card 10 could be located at the bottom of the cards 10, if desired.

The invention is not limited to the particular details of the apparatus depicted, and other modifications and applications are contemplated. Certain other changes may be made in the above described apparatus without departing from the true spirit and scope of the invention herein involved. It is intended, therefore, that the subject matter in the above depiction shall be interpreted as illustrative, and not in a limiting sense.

What is claimed is:

1. A plug-in module card holder for supporting a plurality of circuit cards, each of the cards having a securing lever with a notch, said plug-in module card holder comprising:
    at least two card shelf plates in parallel relationship, each having one or more grooves such that a circuit card is retained in one groove of each of the two card shelf plates, each of said card shelf plates having along an outer edge a tab with first and second channels offset with respect to each other; and
    a strengthening strip for each of such shelf plates, and having an engaging portion substantially U-shaped, having a base and first and second arms attached to the base, and a first ridge being positioned on the inner side of said first arm, and a second ridge being positioned on the inner side of said second arm, said arms sufficiently flexible to pass over said tab, for engaging said first and second ridges of such first and second channels of said tab of said card shelf plate.

2. The apparatus described in claim 1 wherein said strengthening strip includes a retaining portion for mating with the notch in the lever for securing the circuit card holder with a cam action.

3. The apparatus described in claim 1 wherein said tab has a substantially rectangular cross-sectional shape.

4. The apparatus described in claim 2 wherein said retaining portion is substantially L-shaped, having first and second legs, said first leg being attached to said base of said engaging portion, and said second leg mating with the notch in the securing lever of the circuit card.

5. The apparatus described in claim 1 wherein said first and second ridges of said engaging portion have a substantially triangular cross-sectional shape.

* * * * *